(12) United States Patent
  Liu

(10) Patent No.: US 10,637,528 B2
(45) Date of Patent: Apr. 28, 2020

(54) INDUCTOR CIRCUIT AND WIRELESS COMMUNICATION DEVICES

(71) Applicant: PixArt Imaging Inc., Hsin-Chu (TW)

(72) Inventor: Wen-Shun Liu, Hsin-Chu (TW)

(73) Assignee: Audiowise Technology Inc., Hsinchu (TW)

( * ) Notice: Subject to any disclaimer, the term of this patent is extended or adjusted under 35 U.S.C. 154(b) by 0 days.

(21) Appl. No.: 16/285,250

(22) Filed: Feb. 26, 2019

(65) Prior Publication Data

US 2020/0028536 A1 Jan. 23, 2020

Related U.S. Application Data

(60) Provisional application No. 62/701,852, filed on Jul. 23, 2018.

(51) Int. Cl.
| | | |
|---|---|---|
| *H03F 1/56* | (2006.01) | |
| *H04B 1/48* | (2006.01) | |
| *H03F 3/193* | (2006.01) | |
| *H01F 17/00* | (2006.01) | |
| *H01F 38/14* | (2006.01) | |
| *H01F 21/00* | (2006.01) | |

(52) U.S. Cl.
CPC .......... *H04B 1/48* (2013.01); *H01F 17/0006* (2013.01); *H01F 21/00* (2013.01); *H01F 38/14* (2013.01); *H03F 1/565* (2013.01); *H03F 3/193* (2013.01); *H01F 2017/0073* (2013.01); *H01F 2038/143* (2013.01)

(58) Field of Classification Search
CPC .............................. H04B 1/48; H01F 17/0006
See application file for complete search history.

(56) References Cited

U.S. PATENT DOCUMENTS

| | | | |
|---|---|---|---|
| 4,186,359 | A | 1/1980 | Kaegebein |
| 8,165,535 | B2 | 4/2012 | Ahn |
| 8,441,334 | B2 | 5/2013 | Kawano |
| 8,519,814 | B2 | 8/2013 | Feng |
| 9,042,844 | B2 | 5/2015 | Yu |
| 9,070,066 | B1 * | 6/2015 | Oliver .............. G06K 19/07756 |
| 9,184,780 | B2 | 11/2015 | Yu |
| 2004/0242165 | A1 | 12/2004 | Jedeloo |
| 2009/0029654 | A1 | 1/2009 | Fu |
| 2015/0364417 | A1 * | 12/2015 | Lee ..................... H01L 23/5227 |
| | | | 257/531 |

* cited by examiner

*Primary Examiner* — Tuan H Nguyen
(74) *Attorney, Agent, or Firm* — Winston Hsu

(57) ABSTRACT

An inductor circuit includes first inductive circuit, second inductive circuit, and third inductive circuit. First inductive circuit at receiver side has a first end coupled to a first port of an antenna and a second end coupled to an input port of a receiving circuit. Second inductive circuit at transmitter side has a first end and a second end respectively coupled to output ports of a power amplifier. Third inductive circuit at antenna side has a first end coupled to a first port of the antenna and having a second end. Second inductive circuit and the third inductive circuit are disposed on an outer ring to form a ring shape and the third inductive circuit is disposed on an inner ring within the outer ring to form a spiral shape. Third inductive circuit is disposed between the second inductive circuit and the first inductive circuit.

10 Claims, 4 Drawing Sheets

INDUCTOR CIRCUIT AND WIRELESS COMMUNICATION DEVICES

CROSS REFERENCE TO RELATED APPLICATIONS

This application claims priority of U.S. provisional application Ser. No. 62/701,852 filed on 2018 Jul. 23, which is entirely incorporated herein by reference.

BACKGROUND OF THE INVENTION

1. Field of the Invention

The invention relates to a wireless communication mechanism, and more particularly to a novel inductor circuit and corresponding wireless communication devices.

2. Description of the Prior Art

Generally speaking, a conventional method or wireless device is arranged to place an inductor at transmitter side (i.e. TX inductor) and a different inductor at receiver side (i.e. RX inductor) separately. For example, the TX inductor and the RX inductor are respectively implemented on two different circuit chip dies. The disadvantage is that such conventional arrangement takes up more circuit space. In addition, the performance of transmitter/receiver may be degraded.

SUMMARY OF THE INVENTION

Therefore one of the objectives of the invention is to provide a novel inductor circuit such as a novel trifilar component and wireless communication devices, to solve the above-mentioned problems.

According to embodiments of the invention, an inductor circuit is disclosed. The inductor circuit comprises a first inductive circuit, a second inductive circuit, and a third inductive circuit. The first inductive circuit at a receiver side has a first end coupled to a first port of an antenna and a second end coupled to an input port of a receiving circuit. The second inductive circuit at a transmitter side has a first end and a second end respectively coupled to output ports of a power amplifier. The third inductive circuit at an antenna side has a first end coupled to a first port of the antenna and having a second end. The second inductive circuit and the third inductive circuit are disposed on an outer ring to form a ring shape and the third inductive circuit is disposed on an inner ring within the outer ring to form a spiral shape. The third inductive circuit is disposed between the second inductive circuit and the first inductive circuit.

According to the embodiments, a wireless communication device is disclosed. The wireless communication device comprises a first inductive circuit, a second inductive circuit, a third inductive circuit, and a first capacitor. The first inductive circuit at a receiver side has a first end coupled to a first port of an antenna and a second end coupled to an input port of a receiving circuit. The second inductive circuit at a transmitter side has a first end and a second end respectively coupled to output ports of a power amplifier. The third inductive circuit at an antenna side has a first end coupled to a first port of the antenna and having a second end. The first capacitor at the receiver side has a first end coupled to the first end of the first inductive circuit and a second end coupled to the second end of the first inductive circuit. The first switching circuit is disposed between the first capacitor and the first end of the first inductive circuit or between the first capacitor and the second end of the first inductive circuit.

These and other objectives of the present invention will no doubt become obvious to those of ordinary skill in the art after reading the following detailed description of the preferred embodiment that is illustrated in the various figures and drawings.

DETAILED DESCRIPTION

The invention aims at providing a solution/architecture of ultra-low signal loss and switchable T/R (transmitter/receiver) combined trifilar component for a communication standard such as Bluetooth communication applications. In addition, the provided solution/architecture discloses the T/R combined trifilar component with co-coiled technique. An inductor circuit of the T/R combined trifilar component can implemented on a single circuit chip die to save die areas.

Figure 1:
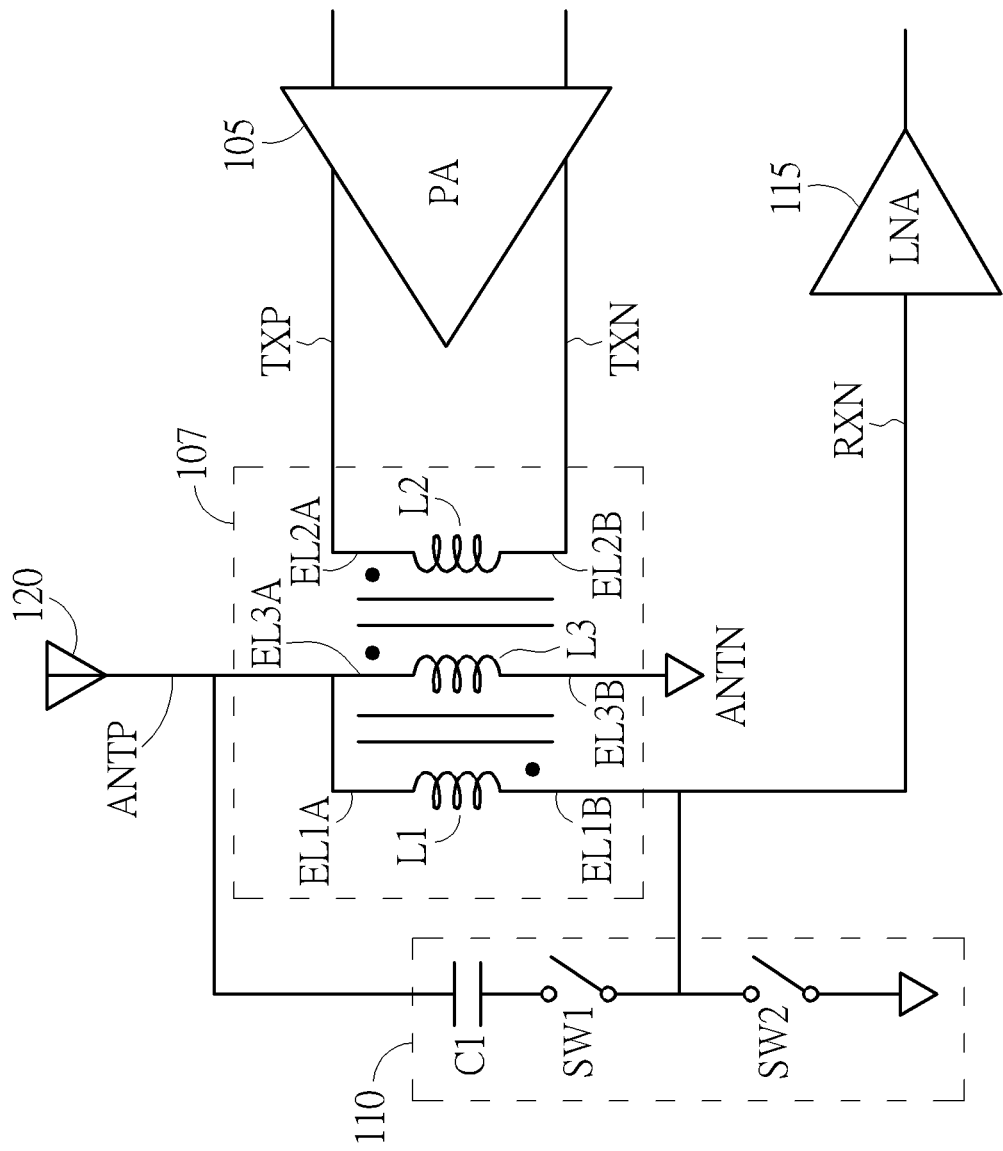
FIG. 1 is a diagram of a wireless communication device according to a first embodiment of the invention.
Figure 2:
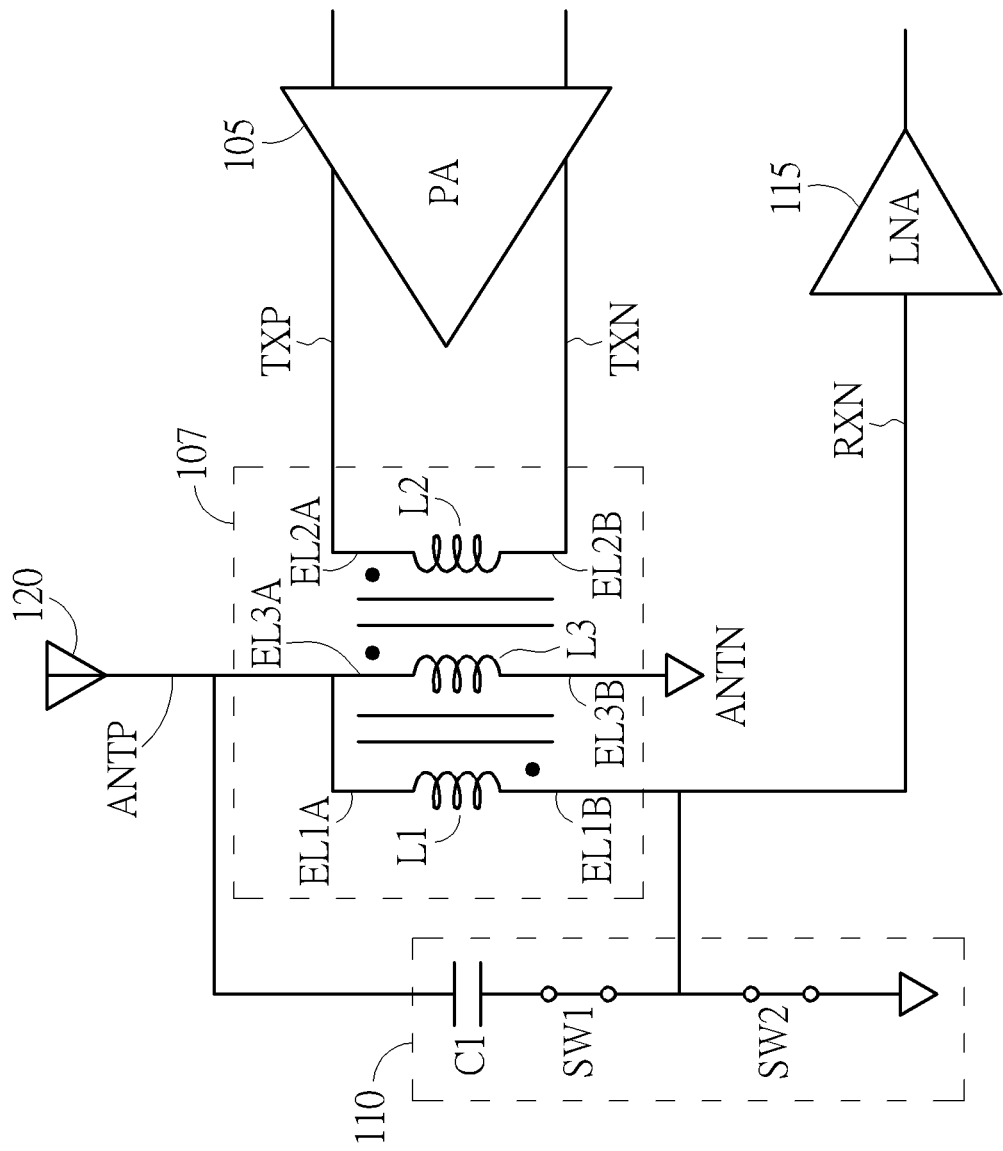
FIG. 2 is a diagram of the device of FIG. 1 operating under the transmitting mode.
Figure 3:
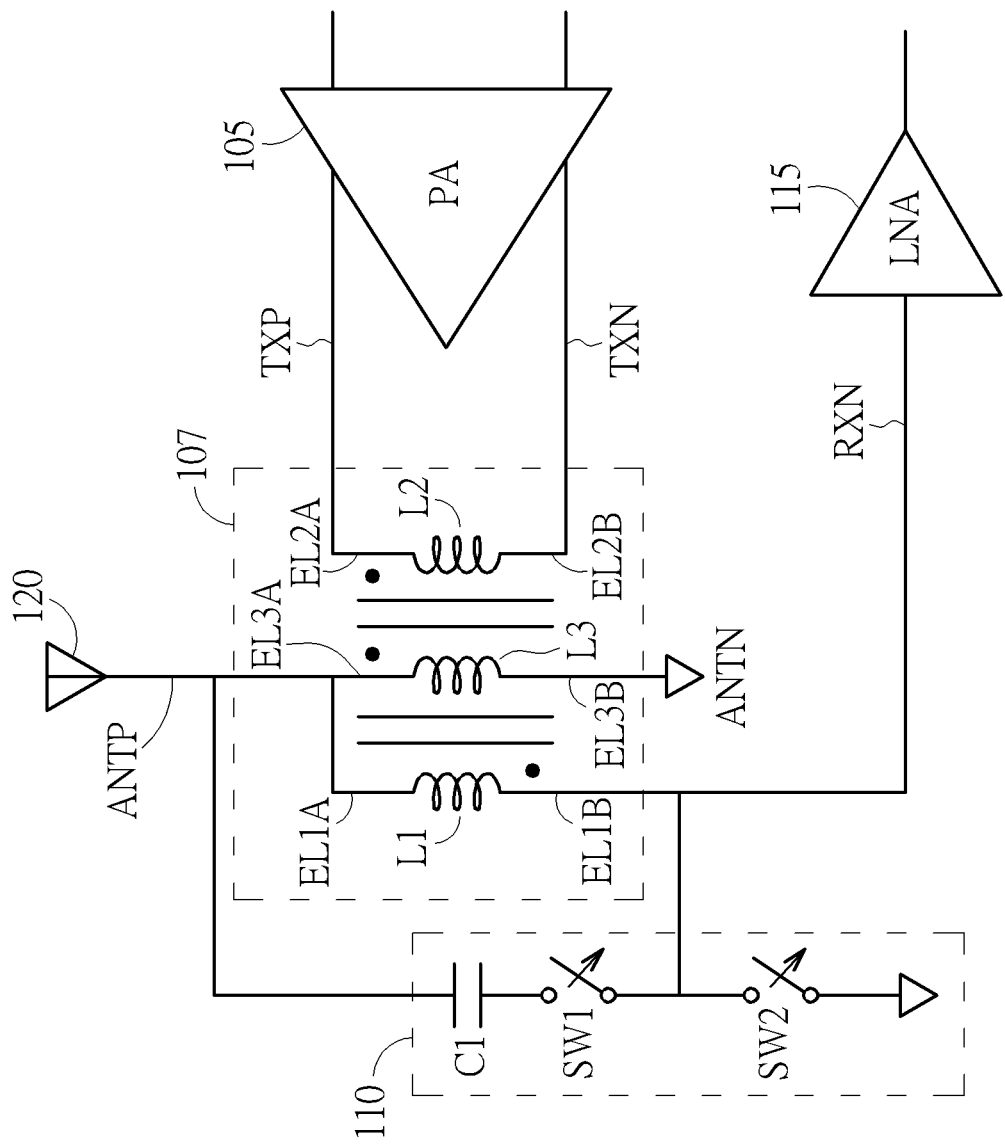
FIG. 3 is a diagram of the device of FIG. 1 operating under the receiving mode.

FIG. 1 is a diagram of a wireless communication device 100 according to a first embodiment of the invention. The wireless communication device 100 comprises a power amplifier (PA) circuit 105, a trifilar component 107, an RF front-end matching circuit 110, and a low noise amplifier (LNA) circuit 115. The wireless communication device 100 is further coupled to an antenna 120. The wireless communication device 100 can be operative under a transmitting mode or a receiving mode. FIG. 2 is a diagram of the device 100 operating under the transmitting mode. FIG. 3 is a diagram of the device 100 operating under the receiving mode.

The trifilar component 107 includes at least three inductive circuits L1, L2 and L3 positioned in a receiver side, a transmitter side and an antenna side of the wireless communication device 100 respectively, wherein the inductive circuits L1, L2 and L3 could be wirings.

The PA circuit 105 for example is a differential PA which is arranged to generate differential output signals at its output ports TXP and TXN according to an input signal which is formed by differential input signals. In other embodiment, the differential PA 105 can be arranged to generate the differential output signals according to an input signal formed by a single-end signal.

The inductive circuit L2 provides an inductance positioned at the transmitter side and includes two input terminals/ends which are respectively coupled to the output ports of the differential PA 105 of a transmitter circuit and respectively used for receiving the differential output signals of the differential PA 105. The first end EL2A of the inductive circuit L2 is coupled to the first differential output signal of the differential PA 105 at the output port TXP, and the second end EL2B of the inductive circuit L2 is coupled to the second differential output signal of the differential PA 105 at the output port TXN.

The inductive circuit L3 provides an inductance positioned at the antenna side and includes two output terminals/ends in which a first end EL3A of inductive circuit L3 is coupled to the matching circuit 110 and a first port ANTP of the antenna 120 while a second end EL3B of inductive circuit L3 is coupled to a second port ANTN of the antenna 120, e.g. a ground level (but not limited). The polarity at the first end EL2A of inductive circuit L2 is identical to the polarity at the first end EL3A of inductive circuit L3.

The matching circuit 110 comprises a switching circuit SW2, a capacitor C1, and a switching circuit SW1.

The inductive circuit L1 includes a first end EL1A coupled to the first end EL3A of inductive circuit L3 and a second end EL1B coupled to an input port RXN of the LNA circuit 115. For better performance, the polarity at the first end EL1A of inductive circuit L1 is different from the polarity at the first end EL3A of inductive circuit L3.

The switching circuit SW1 and capacitor C1 are arranged to be coupled between the first end EL1A and the second end EL1B of the inductive circuit L1. In this embodiment, the capacitor C1 at the receiver side has a first end coupled to the first end EL1A of inductive circuit L1 and has a second end coupled to the second end EL1B of inductive circuit L1. In addition, the switching circuit SW1 is disposed between the capacitor C1 and the second end EL1B of inductive circuit L1. However, this is not intended to be a limitation. In other embodiments, the switching circuit SW1 such as a switch implemented using a switching transistor may be disposed between the capacitor C1 and the first end EL1A of inductive circuit L1.

The switching circuit SW2 is employed and arranged to be coupled between the input port RXN of LNA circuit 115 and a ground level. The inductance provide by the inductive circuit L1 and the capacitor C1 can form a resonator to produce a high impedance so as to avoid signal coupling loss and for example improve the signal sensitivity up to 2 dB (but not limited).

As shown by FIG. 2, during a transmitting mode of the wireless communication device 100, the switching circuits SW1, and SW2 are turned on to become closed, the capacitor C1 and inductive circuit L1 are connected in parallel in this situation, and thus form a resonant cavity which produces a high impedance for the signal generated from the trifilar component 107. Further, the switching circuit SW2 is closed to draw the input port RXN of LNA circuit 115 to the ground level.

Thus, the differential output signals of the different PA 105 pass through the trifilar component 107 and are transmitted or transferred to the antenna 120 with very low or no signal degradation. The signals at the transmitter (TX) path (from the differential PA 105 to the antenna 120) are not coupled to the receiver side since the high impedance provided by the capacitor C1 and inductive circuit L1. For example, the differential PA 105 can deliver 10 dBm RF signal power to the antenna 120. However, this is merely used for illustration and not intended to be a limitation.

As shown by FIG. 3, during a receiving mode of the device 100, all the switching circuits SW1, and SW2 are turned off to become open, the inductive circuit L1 becomes an input matching component of the LNA circuit 115 at the receiver side to achieve lowest noise figure. For example, the noise figure may be 3.7 dB (but not limited). The signals at the receiver (RX) path (from the antenna 120 to the LNA circuit 115) are not coupled to the transmitter side. Compared to conventional circuit architecture, the proposed invention for example can get 2 dB improvement.

Figure 4:
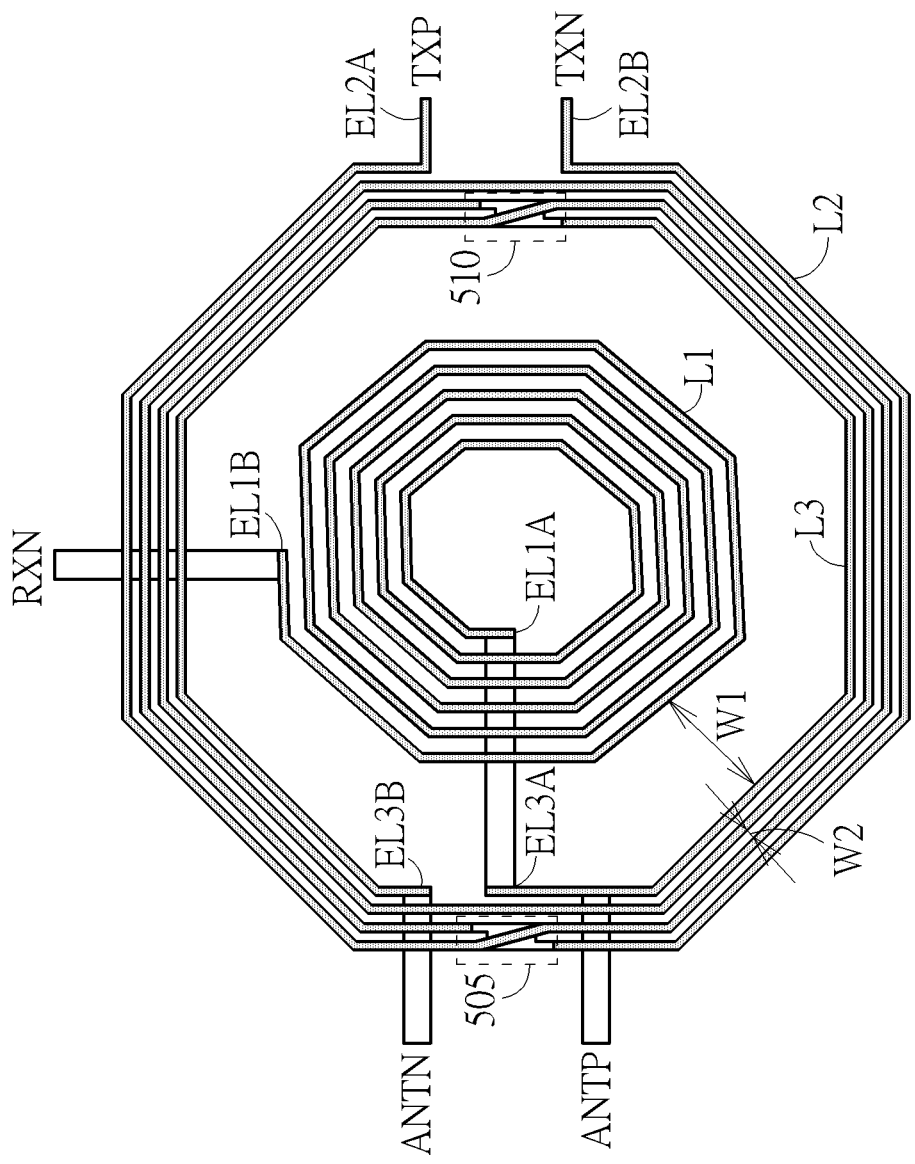
FIG. 4 is a diagram of a circuit layout example showing the inductive circuits L1, L2, and L3 according to an embodiment of the invention.

Further, in other embodiments, to save more chip die areas as well as achieve the above-mentioned designs of inductive circuits, the inductive circuits L1, L2, and L3 are arranged to be positioned on a single circuit chip die to form an inductor circuit by adopting a novel circuit architecture/arrangement. FIG. 4 is a diagram of a physical circuit layout example showing the inductive circuits L1, L2, and L3 according to an embodiment of the invention.

The inductive circuits L1, L2, and L3 comprised by such inductor circuit are disposed on a single circuit chip die area, i.e. in one plane, to save chip area. This circuit architecture/arrangement includes an inner ring and an outer ring. The inductive circuit L1 at the receiver side/path is disposed on the inner ring, and the inductive circuit L1 is formed as a spiral shape as shown by FIG. 4. The inductive circuit L1 at the receiver path has two ends in which the second end EL1B is connected to the input port RXN of the LNA circuit 115 and the first end EL1A is connected to the first end EL3A of inductive circuit L3 and then connected to the first port ANTP of antenna 120. However, it should be noted that the physical circuit layout shown in FIG. 4 may be implemented in a different circuit structure of another communication device and is not limited to the circuit structure of communication device 100. That is, it is not necessary to implement the physical circuit layout of FIG. 4 in the circuit structure of communication device 100 of FIG. 1, and the circuit structure of communication device 100 of FIG. 1 is not necessary to be implemented by the physical circuit layout of FIG.

The plane may comprise two metal levels/layers (top layer and bottom later) and utilize vias (electrical connections between layers in a physical electrical circuit that goes through the plane of one or more adjacent layers) to connect the two levels/layers. For example, the second end EL1B of inductive circuit L1 goes through a via of the bottom layer to connect the port RXN, and the first end EL1A of inductive circuit L1 goes through another via of the bottom layer to connect the first end EL3A of inductive circuit L3. Also, the first end EL3A of inductive circuit L3 is connected to the port ANTP through a via of the bottom layer, and the second end EL3B of inductive circuit L3 is connected to the port ANTN through another via of the bottom layer, as shown in FIG. 4.

The inductive circuits L2 and L3 are disposed on the outer ring to form a ring shape. The ring shape has two circles in which the inductive circuit L3 is positioned or disposed on the inner circle while the inductive circuit L2 is positioned or disposed on the outer circle. The inner circle is closed to the outer circle as shown by FIG. 4. In practice, each circle is arranged by an interlaced circuit structure. For example, the outer circle of inductive circuit L2 has two or more octagon/polygon/circular wires in which an inner wire may be connected, radially interlaced, and extended to an outer wire (as marked by 505 shown in FIG. 4).

The interlaced circuit structure 505 shows that an end of the inner circle of inductive circuit L2 is extended and connected to an end of its outer circle via a lower level such as the bottom layer while another end of the outer circle of inductive circuit L2 is extended and connected to another end of its inner circle via a upper level such as the top layer. From the top view of FIG. 4, the interlaced circuit structure 505 indicates a cross connection. In addition, the interlaced circuit structure 510 also shows that an end of the inner circle of inductive circuit L3 is extended and connected to an end of its outer circle via a lower level such as the bottom layer while another end of the inner circle of inductive circuit L3 is extended and connected to another end of its outer circle via a upper level such as the top layer. From the top view of FIG. 4, the interlaced circuit structure 510 also indicates a cross connection.

For the port TXP, the signal path for example may start from the port TXP, goes through the outer circle of inductive circuit L2, the interlaced circuit structure 505, and the inner circle of inductive circuit L2, and finally ends at the port TXN. In addition, the inner circle of inductive circuit L3 also has two or more octagon/polygon/circular wires in which an inner wire may be connected, radially interlaced, and extended to an outer wire (as marked by 510 shown in FIG. 4). For instance, for the port ANTP, the signal path may start from the port ANTP, goes through the inner circle of inductive circuit L3, the interlaced circuit structure 510, and the outer circle of inductive circuit L3, and finally ends at the port ANTN. That is, each circle of inductive circuits L2 and L3 is not formed as a spiral shape.

Further, it should be noted that the inductive circuit L1 has multiple octagon/polygon/circular wires which are formed as a spiral shape and are connected and extended without a radially interlaced structure. The inductive circuit L1 for example is located in an upper level. The first end EL1A is in the inner end and the second end EL1B is in the outer end. The first end EL1A is connected to the first end EL3A through a path in the lower level under the wires of the inductive circuit L1. From the top view of FIG. 4, the wires of inductive circuit L1 are cross over the path between the first end EL1A and first end EL3A. The second end EL1B is connected to the RXN port through a path in the lower level under the wires of the inductive circuit L2 and wires of the inductive circuit L3. From the top view of FIG. 4, the wires of the inductive circuit L2 and wires of the inductive circuit L3 are cross over the path between the second end EL1B and RXN port.

Additionally, the inductive direction of the inductive circuit L2 is different from the inductive direction of inductive circuit L3. For example, the inductive direction of inductive circuit L2 may be clockwise, and the inductive direction of inductive circuit L3 may be counterclockwise.

During the transmitting mode of wireless communication device 100, a signal current may be generated at the first end EL2A of inductive circuit L2, i.e. the first port TXP of differential PA 105, and then sequentially flows or passes through the upper half of the outer wire/trace of inductive circuit L2, a top layer of the interlaced circuit structure 505, the bottom half of the inner wire/trace of inductive circuit L2, the upper half of the inner wire/trace of inductive circuit L2, a bottom layer of the interlaced circuit structure 505, and bottom half of the outer wire/trace of inductive circuit L2, and the second end EL2B of inductive circuit L2, i.e. the second port TXN of differential PA 105, sequentially. That is, the inductive/signal/current direction is counterclockwise. In this situation, the inductive direction of inductive circuit L3 is configured to be clockwise which is opposite to that of inductive circuit L2. For example, in response to such signal current generated at the first end EL2A of inductive circuit L2, an inductive current may generated at the first end EL3A of inductive circuit L3 and then transmitted or outputted to the first port ANTP of antenna 120. Thus, the inductive current direction/path sequentially pass through the second end EL3B of inductive circuit L3, the upper half of the inner wire/trace of inductive circuit L3, a top layer of the interlaced circuit structure 510, the bottom half of the outer wire/trace of inductive circuit L3, the upper half of the outer wire/trace of inductive circuit L3, a bottom layer of the interlaced circuit structure 510, and bottom half of the inner wire/trace of inductive circuit L3, and the first end EL3A of inductive circuit L3.

In addition, during the receiving mode of wireless communication device 100, the inductive direction of inductive circuit L3 is different from the inductive direction of inductive circuit L1. For example, if a signal current received at the first port ANTP of antenna 120, the inductive path/direction of inductive circuit L3 from its first end EL3A to its second end EL3B is counterclockwise while the inductive path/direction of inductive circuit L1 from its first end EL1A to its second end EL1B and then to the input port RXN of LNA circuit 115 is clockwise.

Further, the circuit distance between the outer ring and the inner ring is larger than the circuit distance between the outer circle and inner circle on the outer ring. That is, the space/circuit distance W1 between the outer wire of inductive circuit L1 and the inner wire of inductive circuit L3 is configured to be larger than the space/circuit distance W2 between the outer wire of inductive circuit L3 and the inner wire of inductive circuit L2.

In addition, equivalently the first end EL1A of inductive circuit L1 can be regarded as an external connector of the spiral shape which is arranged to be coupled to the first end EL3A of inductive circuit L3.

In addition, for the implementation of this embodiment (but not limited), the inductive circuit L1 from the first end EL1A to the second end EL1B is implemented by using a metal trace which is wound around in a clockwise direction, and the inductive circuit L3 from the first end EL3A to the second end EL3B is implemented by using a metal trace which is wound around in a counterclockwise direction while the inductive circuit L2 from the first end EL2A to the second end EL2B is implemented by using a metal trace which is wound around in the counterclockwise direction. However, this is not intended to be a limitation. In other embodiments, the metal trace of inductive circuit L1 may be wound around in the counterclockwise direction, and the metal traces of inductive circuits L2 and L3 may be wound around in the opposite direction, i.e. the clockwise direction. This also obeys the spirit of the invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An inductor circuit, comprising:
   a first inductive circuit, having a first end coupled to a first port of an antenna and a second end coupled to an input port of a receiving circuit;
   a second inductive circuit, having a third end and a fourth end respectively coupled to output ports of a power amplifier; and
   a third inductive circuit, having a fifth end coupled to the first port of the antenna and having a sixth end;
   wherein the second inductive circuit and the third inductive circuit are disposed on an outer ring to form a ring shape and the third inductive circuit is disposed on an inner ring within the outer ring to form a spiral shape; and, the third inductive circuit is disposed between the second inductive circuit and the first inductive circuit.

2. The inductor circuit of claim 1, wherein the inductor circuit includes at least a top layer and a bottom layer.

3. The inductor circuit of claim 2, wherein each of the second conductive circuit and the third conductive circuit comprises an inner wire and an outer wire, and wherein the inner wire and the outer wire are disposed on the top layer, and the inner wire is connected, partially and radially interlaced, and then extended to the outer wire through the bottom layer.

4. The inductor circuit of claim 3, wherein a space distance between an outer wire of the first inductive circuit and the inner wire of the third inductive circuit on the outer ring is larger than a space distance between the inner wire of the second inductive circuit and the outer wire of the third inductive circuit.

5. The inductor circuit of claim 2, wherein the first end of the first inductive circuit is in an inner end of the spiral shape and is arranged to connect the fifth end of the third inductive circuit through the bottom layer.

6. The inductor circuit of claim 1, wherein the first inductive circuit, the second inductive circuit, and the third inductive circuit are disposed within a single chip die.

7. The inductor circuit of claim 1, wherein a current/signal inductive direction of the first inductive circuit is opposite to a current/signal inductive direction of the third inductive circuit during a receiving mode.

8. The inductor circuit of claim 7, wherein the current/signal inductive direction of the third inductive circuit is a counterclockwise direction, and the current/signal inductive direction of the first inductive circuit is a clockwise direction; and, the current/signal inductive direction of the second inductive circuit is identical to the current/signal inductive direction of the third inductive circuit.

9. The inductor circuit of claim 1, wherein each of the ring shape and the spiral shape is formed in a shape of an octagon, a polygon, or a circle.

10. The inductor circuit of claim 1, wherein the sixth end of the third inductive circuit is coupled to a second port of the antenna.

* * * * *